United States Patent [19]
Schwob

[11] Patent Number: 5,389,813
[45] Date of Patent: Feb. 14, 1995

[54] POWER SEMICONDUCTOR DEVICE WITH TEMPERATURE SENSOR

[75] Inventor: Walter Schwob, Commugny, Switzerland

[73] Assignee: Motorola, Inc., Schaumburg, Ill.

[21] Appl. No.: 970,743

[22] Filed: Nov. 3, 1992

[30] Foreign Application Priority Data

Nov. 6, 1991 [GB] United Kingdom ............... 9123558

[51] Int. Cl.$^6$ ........................................... H01L 23/58
[52] U.S. Cl. .................... 257/469; 257/341; 257/470; 257/551
[58] Field of Search ............... 257/469, 470, 341, 551

[56] References Cited

U.S. PATENT DOCUMENTS 3,936,863  2/1976  Olmstead .
4,028,564  6/1977  Streit et al. ................. 257/469
4,903,106  2/1990  Fukunaga et al. ........... 257/469
5,049,961  9/1991  Zommer ....................... 257/470
5,070,322  12/1991 Fujihira ........................ 257/470

FOREIGN PATENT DOCUMENTS 1191133  5/1970  Germany .
1303337  1/1973  Germany .

Primary Examiner—Edward Wojciechowicz

[57] ABSTRACT

This invention relates to a power semiconductor device with a temperature sensor (32). The power semiconductor device (36), such as a power transistor, comprises a plurality of power device cells (108). The temperature sensor comprises a temperature sensing diode (34) implemented in at least one of the power device cell (108) such that the power device cell and sensing diode have a common conduction region (102), whereby the temperature sensor can directly sense the temperature of the power device cell.

5 Claims, 3 Drawing Sheets

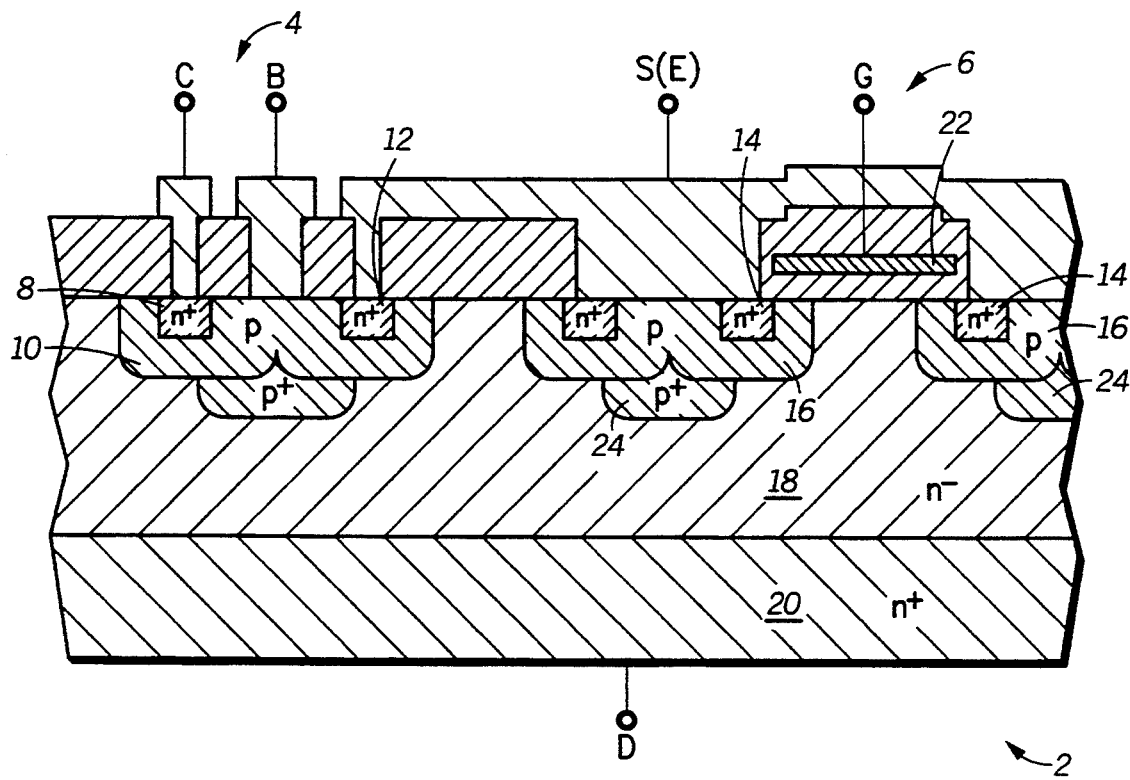
FIG.1
—PRIOR ART—
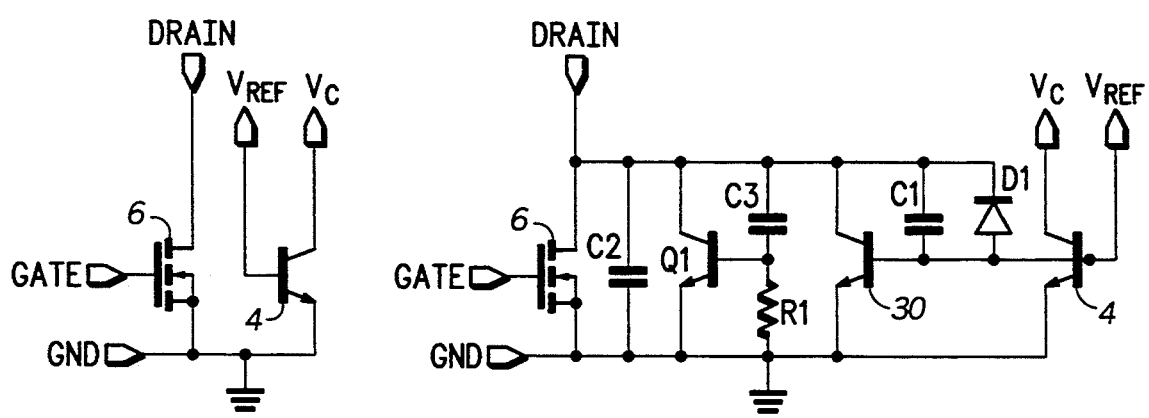
FIG.2a
—PRIOR ART—
FIG.2b
—PRIOR ART—

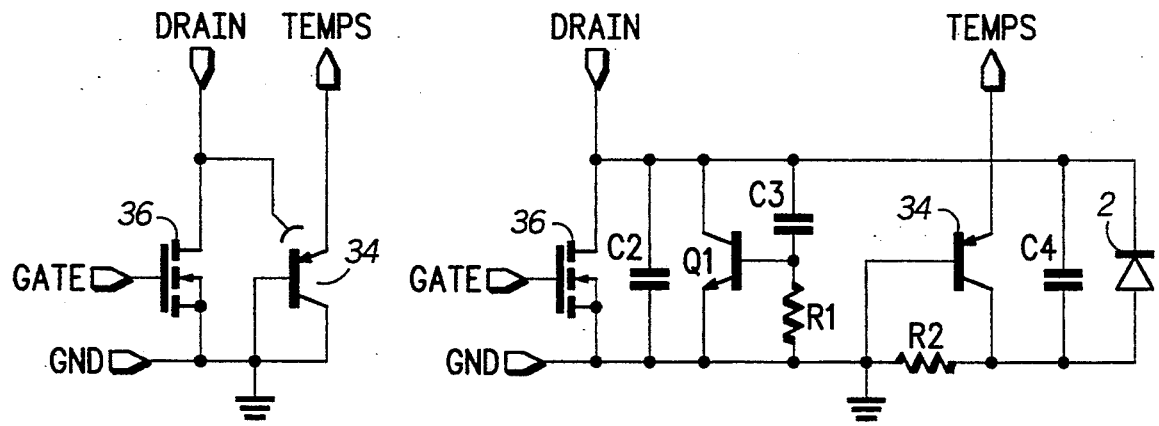
*FIG.4a*   *FIG.4b*
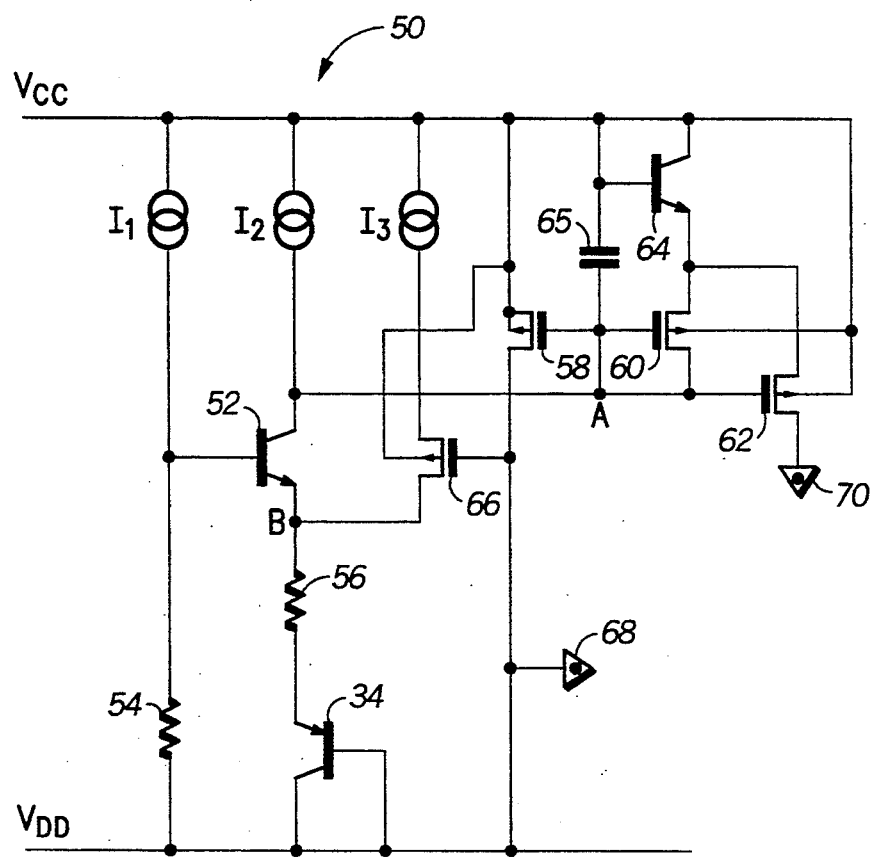
*FIG.5*

POWER SEMICONDUCTOR DEVICE WITH TEMPERATURE SENSOR

FIELD OF THE INVENTION

This invention relates to power semiconductor devices with temperature sensors.

BACKGROUND OF THE INVENTION

The trend amongst designers these days is towards higher integration of control circuitry and power output devices on the same chip. Such integration calls for adequate circuit protection functions in order to guarantee high circuit reliability in extreme conditions.

For output power devices such as power transistors, the temperature protection function is an important function, particularly under short circuit conditions. The power transistors may be in bipolar and/or MOS technology. The temperature protection function senses the temperature of the heat source in the power transistors, which is the active junction or channel of the power transistor, and in response to the sensed temperature controls the drive to the power transistor.

A standard technique which is used to sense the 'junction' temperature of a power transistor consists of a temperature sensor, such as a diode and/or a transistor, placed in the vicinity of the power transistor. However, the accuracy of the temperature sensing of this technique is low due to the fact that silicon is a poor heat conductor and that the temperature sensor cannot be located close enough to the active junction or channel of the power transistor.

Another disadvantage with this technique is that with circuits having a low thermal resistance from the power package to an 'infinite' heatsink, this technique is inefficient and can lead to the melt down of the power transistor. The operating conditions for which melt down may occur is often found in automotive applications where heat sink temperature varies between $-40°$ C. and $125°$ C.

An improvement on the above technique is disclosed in U.S. Pat. No. 4,903,106. This patent discloses integrating a temperature sensing device on the same substrate as a power device. This technique avoids the need for a temperature sensor exterior to the power device. Since the temperature sensing device is formed on the same substrate with the power device, the accuracy of the sensed temperature is improved.

However, the structure of the temperature sensing device disclosed in this U.S. patent is such that parasitic components of the device cannot be neglected during normal operation. In fact, these parasitic components can affect the temperature sensing device to the extent that it provides wrong information to a temperature detector.

Furthermore, although the temperature sensing device and power device have a common substrate, they do not share common junctions and require substrate isolation. Thus, the temperature sensing device is not electrically merged with the power device, and so the physical distance between the power device and the temperature sensing device is still sufficiently large to limit the accuracy of temperature sensing.

SUMMARY OF THE INVENTION

In accordance with the present invention there is provided a power semiconductor device with a temperature sensor comprising:

a plurality of power device cells coupled to form the power semiconductor device, the temperature sensor comprising a temperature sensing diode implemented in a power device cell such that the power device cell and sensing diode have a common conduction region, whereby the temperature sensor can directly sense the temperature of the power device cell.

An advantage of the present invention is that the temperature sensor can be located much closer to the heat source of the power device than the prior art sensor, thus enabling improved accuracy in the temperature sensing. Furthermore, the circuit layout becomes denser.

The power semiconductor device may be a FET power transistor.

Preferably, a terminal of the temperature sensing diode is coupled to ground. The temperature sensing diode may comprise a bipolar transistor having a base and collector coupled to ground and an emitter.

In a preferred embodiment the temperature sensing diode is formed by four diffusion regions, the fourth region providing isolation from the plurality of power device cells.

An advantage of this is that the isolation provides high noise immunity against voltage spikes on the drain terminal of a power FET. Furthermore, the structure of the sensor ensures that no parasitic device alters the sensing accuracy during normal operation.

BRIEF DESCRIPTION OF THE DRAWING

A power semiconductor device with temperature sensor will now be described by way of example only with reference to the accompanying drawings in which:

FIG. 1 is a cross-sectional view of a prior art power semiconductor device with temperature sensor;

FIG. 2a is a schematic circuit diagram of the prior art power semiconductor device of FIG. 1;

FIG. 2b is a schematic circuit diagram including the parasitic components of FIG. 2a;

FIG. 4a is a schematic circuit diagram of the power semiconductor device of FIG. 3;

FIG. 4b is a schematic circuit diagram including the parasitic components of the power semiconductor device of FIG. 3; and FIG. 5 is a circuit diagram of a temperature control circuit for use with the temperature sensor in accordance with the present invention.

DETAILED DESCRIPTION

Figure 3:
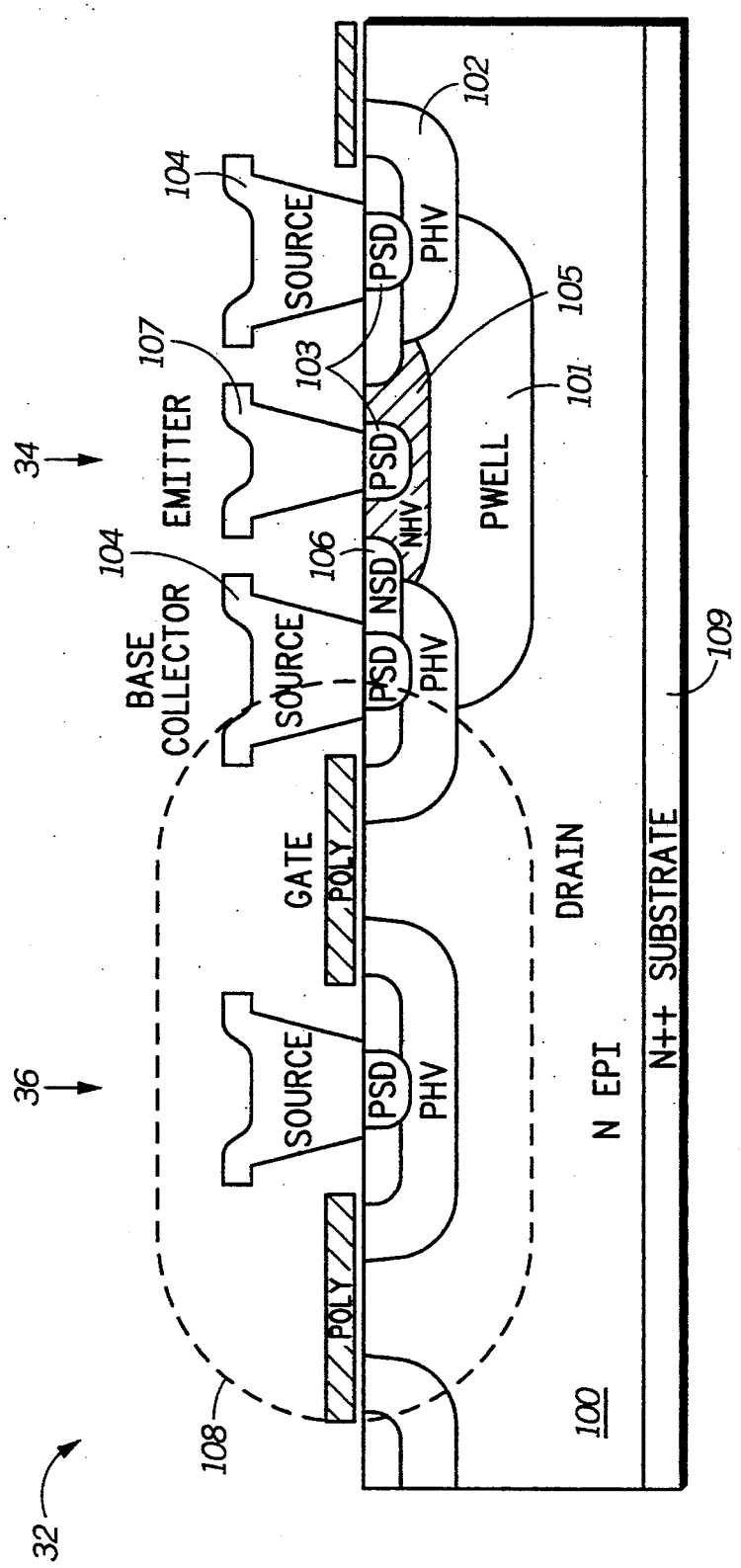
FIG. 3 is a cross-sectional view of a power semiconductor device with temperature sensor in accordance with the present invention.

Referring firstly to FIG. 1, the semiconductor device 2 disclosed in U.S. Pat. No. 4,903,106, the disclosure of which is incorporated herein by reference, comprises a power device formed by a n-channel enhancement field effect transistor (FET) 6 and a temperature sensing device formed by an npn bipolar transistor 4. The npn sensing transistor 4 comprises a n+-type region 8, which forms the collector region, a p-type region 10, which forms the base region, and a n+-type region 12, which forms the emitter region. The n+-channel enhancement field effect transistor (FET) 6 consists of the n+-type region 14, the p-type region 16, the n−-type epitaxial layer 18, the n+-type substrate 20 and the polysilicon layer 22. The source S, gate G and drain D of the power FET 6 are indicated on FIG. 1. A diode formed by p-type region 16, the p+-type region 24, the n−-type epitaxial layer 18 and the n+-type substrate 20 couples the drain to the source.

From FIG. 1 it is apparent that the sensing transistor 4 is not merged with the power FET 6. That is, the sensing transistor 4 and power FET 6 share a common substrate 20 but different regions form the base, emitter and collector regions of the sensing transistor 4, compared to the source, drain and gate regions of the power FET 6. There is therefore a significant distance between the heat source and the temperature sensor which limits the accuracy of the temperature sensor of this structure.

The sensing transistor 4 comprises a three-layer structure wherein the collector region is not isolated from the drain.

FIG. 2a shows an electrical circuit diagram of the semiconductor device 2 shown in FIG. 1. The source S of power FET 6 is coupled together with the emitter E of sensing transistor 4 to ground. The gate G of power FET 6 receives a drive signal and the drain D is coupled via a load (not shown) to a power supply (not shown). The base B of sensing transistor 4 is coupled to receive a reference voltage and the collector C is coupled to a temperature detection circuit (not shown).

The operation of the temperature sensing device of the semiconductor device 2 utilises the fact that as temperature increases the base-emitter voltage of a bipolar transistor decreases.

In normal operation, when the temperature of the power FET 6, and hence the sensing transistor 4, is below a predetermined threshold, the sensing transistor 4 is 'off' and the voltage at the collector is tied to a supply voltage: the threshold is determined by the reference voltage on the base of sensing transistor 4. Once the temperature of the power FET 6 increases and hence the temperature of the sensing transistor 4 goes above the predetermined threshold, the sensing transistor 4 becomes conducting and this can be detected by the detection circuit (not shown) by detecting the change in voltage at the collector. If the transistor senses that the temperature of the power FET 6 has gone above the predetermined threshold, the detection circuit (not shown) can be used to switch the power FET 6 'off'.

Referring now also to FIG. 2b, the parasitic components which are inherent to the semiconductor device 2 include a vertical bipolar transistor 30, a capacitor C1 and a diode D1. The parasitic components of power FET 6 comprise transistor Q1, capacitors C2 and C3 and resistor R1.

The parasitic transistor 30 is coupled in parallel with the lateral sensing bipolar transistor 4 and has a common base therewith. The collector of the parasitic transistor 30 is coupled to the drain of power FET 6 and its emitter is coupled to ground. The parasitic capacitor C1 and diode D1 are both coupled between the common base and the drain of power FET 6.

Due to the common base coupling of the sensing transistor 4 and the parasitic transistor 30 and the respective doping levels of these two transistors, the leakage current in the collector as well as the base of the parasitic transistor 30 cannot be ignored during normal circuit operation. Furthermore, the parasitic capacitor C1 couples all voltage transients appearing on the drain directly to the base of the sensing transistor 4. Also, during negative voltage spikes at the drain, the diode D1 can cause a current to flow in the collector of the sensing transistor 4 and thus, disturb the sensing operation. Each of these effects or a combination thereof can cause the sensing transistor 4 to indicate that the threshold temperature has been reached when in fact it has not. The result of this is that the power device may be switched off even when its temperature is below the predetermined threshold.

Thus, the structure of the power semiconductor device and temperature sensor described in U.S. Pat. No. 4,903,106 has associated parasitic components which can alter the sensing accuracy during normal operation.

Referring now to FIG. 3, a power semiconductor device with temperature sensor 32 in accordance with a preferred embodiment of the present invention comprises a MOS power FET transistor 36 having a plurality of power transistor cells, only one of which 108 is shown, and a pnp bipolar sensing transistor 34. The sensing transistor 34 is coupled to form a diode.

The sensing transistor 34 comprises a N-type EPI region 100 in common with the drain region of the power FET 36 (this is shown in FIG. 4a by a fourth terminal of the sensing transistor 34). The collector region of the sensing transistor 34 is formed by a p−-type diffusion 101 (PWELL) which is connected to a source terminal 104 through a p−-type region 102 (PHV) and p+-type region 103 (PSD). The base of the sensing transistor 34 comprises a n−-type diffusion 105 (NHV) which is electrically coupled to the source terminal 104 via a n+-type region 106 (NSD). The emitter of the sensing transistor 34 is formed by a p+-type diffusion 103 (PSD) which is connected to the emitter terminal 107.

The sensing transistor 34, therefore, has a four-layer structure comprising the layers PSD, NHV, PWELL and EPI. The junction of the EPI region 100 and PWELL region 101 ensures that the sensing transistor 34 is isolated from the drain of the power FET 36. An advantage of this structure is that temperature sensing is not affected by noise on the drain of the power FET 36. As discussed above this is a problem with the prior art structure.

Due to the fact that both devices use common diffusion regions, the temperature sensing transistor 34 is electrically merged with the power transistor cells 108 of the power FET 36. That is, the PSD diffusion 103 couples the source terminal 104 to the back-gate formed by PHV region 102 of the power transistor cells 108 and the NSD diffusion 106 forms the source of the power transistor cells 108. An advantage of such a merged structure can be seen from FIG. 3: since the sensing transistor 34 is located within a power transistor cell 108, the heat generated in the channel (PHV) of the power transistor cells can be accurately detected.

Although the merged structure, as described above, provides improved accuracy in temperature sensing, some applications may require that the temperature sensing transistor 34 is separated from the transistor cells 108. In these applications, sensing transistor 34 would still have the four-layer structure (i.e. PSD NHV, PWELL and EPI) as shown in FIG. 3 so that the modified structure would work in the same way.

The power semiconductor device with temperature sensor 32 can be implemented in different power MOS processes in which case the four-layer structure of the sensing transistor 34 will be stacked onto different substructures. For example, for a vertical process, a drain terminal (not shown) is connected to a n++-type substrate 109 at the bottom of the integrated circuit whereas for an up-drain process, a n++-type diffusion region (not shown) couples the n++-type substrate 109 to a drain terminal which is located on the top of the integrated circuit.

FIG. 4a shows an electrical circuit diagram of the power FET 36 comprising a plurality of the power transistor cells 108 in parallel and the sensing transistor 34 of FIG. 3. The source S of the power FET 36 is coupled to ground. The base and collector of sensing transistor 34 are also coupled to ground. The gate G of power FET 36 receives a drive signal and the drain D is coupled to a power supply via a load (not shown). The emitter of sensing transistor 34 provides a signal TEMPS indicative of the temperature of the power FET 36.

Referring now also to FIG. 4b, the parasitic components which are inherent to the power semiconductor device with temperature sensor 32 include a capacitor C4, a resistor R2 and a diode D2. The parasitic components of the power FET 36 comprise transistor Q1, capacitors C2 and C3 and resistor R1.

It will be appreciated from the above description of FIG. 3, that FIGS. 4a and 4b also represent the electrical circuit diagrams of a power transistor having a four-layer temperature sensor separate from the power transistor cells.

The parasitic capacitor C4 represents the junction capacitance between the collector and the drain of power FET 36 and has a low value. The resistor R2 is coupled across the collector and base of the sensing transistor 34 and represents the collector access resistance (formed by regions PSD, PHV, PWELL) having a low value. The parasitic diode D2 is coupled between ground and the drain of power FET 36.

Since the base and collector of sensing transistor 34 is coupled to ground, any capacitive coupling of parasitic voltage spikes from the drain terminal has no influence on the normal operation of the temperature sensor. Such voltage spikes are particularly common in harsh automotive environments.

During negative voltage transients, the diode D2 in parallel with parasitic transistor Q1 may draw some current through R2 and in doing so slightly modulate the collector voltage of sensing transistor 34. Since the temperature sensing function depends on the base-emitter voltage of sensing transistor 34, this will not affect the accuracy of the temperature sensor.

The temperature sensing function of the power semiconductor device with temperature sensor in accordance with the invention will now be described with reference to FIG. 5. FIG. 5 shows a preferred temperature control circuit which can be used with the power semiconductor device with temperature sensor 32 to determine when the temperature of the power FET 36 has reached a predetermined threshold value. It will be appreciated by a person skilled in the art that other circuits which perform the same function may be used.

The temperature control circuit 50 comprises a npn transistor 52 coupled to the emitter of the sensing transistor 34 via a resistor 56. The transistor 52 receives a reference voltage at its base which is dependent on the current source $I_1$ and the resistor 54 which are coupled in series between a power supply $V_{cc}$ and ground GND. The reference voltage may rise slowly with temperature.

The collector of transistor 52 is coupled to first terminal of a current source $I_2$. The second terminal of current source $I_2$ is coupled to the power supply $V_{cc}$. The collector of transistor 52 is also coupled to a node A. Node A is coupled to the commonly-coupled gates of p-channel MOSFETs 58 and 60. The source of FET 58 is coupled to the power supply $V_{cc}$ and its drain is coupled to a first output 68 of the temperature control circuit 50. The substrate of FET 58 is tied to its source. The drain of FET 60 is coupled to a gate of a p-channel MOSFET 62 having a source coupled to the source of FET 60 and a drain coupled to a second output 70. The FETs 60 and 62 form a current mirror. The substrates of FETs 60 and 62 are coupled to the power supply $V_{cc}$.

The source of FET 60 is coupled to the power supply $V_{cc}$ through the emitter-collector conduction path of npn transistor 64. The base of the transistor 64 is coupled to the power supply $V_{cc}$ and to node A via a capacitor 65. The capacitor 65 provides noise-immunity against noise due to current sources $I_1$, $I_2$ and $I_3$ and from the sensing transistor 34. The capacitor 65 can be excluded from the temperature control circuit without altering the operation thereof.

A p-channel MOSFET 66, having a source coupled to a current source $I_3$, and a gate coupled to the drain of FET 58, has a drain coupled to the emitter of transistor 52 at node B. The substrate of FET 66 is coupled to $V_{cc}$.

The temperature sensor in accordance with the present invention utilises the fact that the base-emitter voltage of a pnp transistor decreases with temperature. The change in base-emitter voltage is approximately $-1.8$ mV/° C. The operation of the temperature control circuit will now be described with reference to FIGS. 3 and 5.

In normal operation when the temperature of the power FET 36 is below a threshold temperature, the sum of the two base-emitter voltage drops of transistor 52 and the sensing transistor 34 is such that the reference voltage on the base of transistor 52 is not sufficient to turn the transistor 52 'on'. The collector voltage of transistor 52 is therefore held at $V_{cc}$. Since node A is at $V_{cc}$, FET 58 is 'off' and the signal at the first output 68 is low.

As the temperature of the power FET 36 increases, the temperature of sensing transistor 34 and transistor 52 increases and the sum of the two base-emitter voltage drops decreases. Eventually, the base-emitter voltage sum is sufficiently small for transistor 52 to become conducting whereby current flows in the collector of transistor 52 and the collector voltage decreases. The reference voltage at the base of transistor 52 is chosen so that transistor 52 becomes conducting at the threshold temperature.

The voltage at node A decreases from $V_{cc}$ as the collector voltage decreases. The FET 58 is switched 'on' when the voltage on its gate is approximately 1.4 V below $V_{cc}$ whereby the signal at the first output 68 is pulled high to $V_{cc}$. Thus, the signal at the first output indicates when the threshold temperature has been reached and can be used to control the drive to the power FET 36. The FET 60 does not switch with FET 58 because of the base-emitter voltage drop of transistor 64.

In order to ensure that the signal at the first output 68 is an on/off signal, FET 66 is used to introduce hysteresis in the output signal. The amount of hysteresis is determined by the value of resistor 56 and the current sourced by current source $I_3$. FET 66 is an optional feature of the temperature control circuit 50. The parasitic access resistor R2 of the sensing transistor 34 may also introduce hysteresis.

As the temperature increases, transistor 52 becomes more conducting and the collector current increases. FET 60 is switched 'on', and acts as a current mirror with FET 62 which provides an output signal at the second output 70. When the collector current exceeds the current provided by $I_2$, a DC current through transistor 64 and FET 60 supplies a current equal to the difference between $I_2$ and the collector current to the collector of transistor 52. This 'difference' current is mirrored by transistor 62 and fed to the second output 70. Thus, the analog output signal at 70 provides a temperature proportional current above the threshold temperature.

The temperature control circuit 50 therefore provides a digital on/off output signal at the first output 68 when the temperature reaches the threshold temperature and an analog signal, which is proportional to temperature, at the second output when the temperature goes above the threshold temperature.

Although the invention has been described in relation to a power MOSFET device, the invention is not restricted thereto and also applies to bipolar power transistors or other power semiconductor devices such as power thyristors or power diodes.

It will be appreciated that the p-n polarity of the power semiconductor device with temperature sensor described with reference to FIGS. 3, 4a and 4b may be reversed.

In summary, the present invention provides a power semiconductor device with temperature sensor whose accuracy is not compromised by inherent parasitic devices. Furthermore, the temperature sensor has high noise immunity against voltage transients fed through the drain of the power transistor and remains operational even when there are negative voltage spikes on the drain. The four-layer structure of the temperature sensor ensures self-isolation from the power FET.

The merged structure of the power semiconductor device with temperature sensor in accordance with the present invention ensures that the temperature sensor is close enough to the heat producing channel of the power transistor and so can provide high temperature sensing accuracy with a small impact on the size of the integrated circuit.

What is claimed is:

1. A power FET semiconductor device with a temperature sensor comprising:

a semiconductor substrate of a first conductivity type, a plurality of power device cells formed on the semiconductor substrate coupled to form the power FET semiconductor device, and the temperature sensor comprising a temperature sensing diode formed on the semiconductor substrate, wherein the temperature sensing diode and a power device cell have at least one common diffusion region, whereby the temperature sensor can directly sense temperature of the power device cell, and wherein the temperature sensing diode has a separate terminal, and wherein the temperature sensing diode comprises four regions, wherein a fourth region of the temperature sensing diode is formed by a first conductivity type epitaxial layer formed on the semiconductor substrate;

a third region of the temperature sensing diode is formed by a second conductivity type first area of low impurity concentration formed in part of the first conductivity type epitaxial layer, wherein the third region and the first conductivity type epitaxial layer form a junction that isolates the temperature sensing diode from the plurality of power device cells;

a second region of the temperature sensing diode is formed by a first conductivity type region of low impurity concentration formed in part of the third region; and a first region of the temperature sensing diode is formed by a second conductivity type region of high impurity concentration formed in part of the second region, wherein the separate terminal is coupled to the first region, and wherein the power device cell comprises:

a drain region formed by the first conductivity type epitaxial layer;

a gate region formed by a second conductivity type region of low impurity concentration formed in part of the first conductivity type epitaxial layer and the third region;

a source region formed by a first conductivity type region of high impurity concentration formed in part of the gate region and the second region; and a coupling region formed by a second conductivity type region of high impurity concentration extending through the source region to the gate region, wherein the coupling region forms the at least one common diffusion region, and wherein a conduction path of the temperature sensing diode comprises the first, second, and third regions of the temperature sensing diode and the gate region and coupling region of the power device cell.

2. A power FET semiconductor device with a temperature sensor formed on a same integrated circuit comprising:

a semiconductor substrate of a first conductivity type;

a plurality of power FET device cells formed on the semiconductor substrate coupled to form the FET power semiconductor device; and a temperature sensing diode for directly sensing the temperature of at least one of the plurality of power FET device cells, the temperature sensing diode being formed on the semiconductor substrate, wherein the temperature sensing diode and the at least one of the plurality of power FET device cells have a common diffusion region, and wherein the temperature sensing diode has an electrode that is separate from the at least one of the plurality of power FET device cells and wherein the temperature sensing diode is isolated from a remainder of the plurality of power FET device cells, and wherein the temperature sensing diode comprises first, second, third, and fourth regions, and wherein the fourth region of the temperature sensing diode is formed by a first conductivity type epitaxial layer formed on the semiconductor substrate, wherein the temperature sensing diode is isolated from the remainder of the plurality of power FET device cells by the fourth region;

the third region of the temperature sensing diode is formed by a second conductivity type first region of low impurity concentration formed in part of the fourth region, wherein the third region and the fourth region form a junction that isolates the temperature sensing diodes from the plurality of power FET device cells;

the second region of the temperature sensing diode is formed by a first conductivity type region of low impurity concentration formed in part of the third region; and the first region of the temperature sensing diode is formed by a second conductivity type region of high impurity concentration formed in part of the second region, and wherein the electrode is connected to the first region, and wherein the at least one of the plurality of power FET device cells comprises:

a drain region formed by the fourth region;

a gate region formed by a second conductivity type region of low impurity concentration formed in part of the fourth region and the third region;

a source region formed by a first conductivity type region of high impurity concentration formed in part of the gate region and the second region; and a coupling region formed by a second conductivity type region of high impurity concentration extending through the source region to the gate region, wherein the coupling region forms the common diffusion region, and wherein the temperature sensing diode has a conduction path comprising the first, second, and third regions of the temperature sensing diode and the gate region and coupling region of the at least one of the plurality of power FET device cells.

3. The power FET semiconductor device of claim 1 further comprising:

a temperature control circuit for use with the power FET semiconductor device, the temperature control circuit comprising:

an input coupled to the separate terminal of the temperature sensing diode for receiving an input signal indicative of temperature of the power semiconductor device;

a first output;

a second output;

switching means coupled to the input of the temperature control circuit for providing an output signal at the first output of the temperature control circuit, said switching means switching the output signal from a first state to a second state when the input signal indicates that the temperature of the power FET semiconductor device has reached a predetermined threshold level; and circuit means having an input coupled to the switching means and an output coupled to the second output of the temperature control circuit, said circuit means providing a signal at the second output of the temperature control circuit which is proportional to the temperature of the power FET semiconductor device when the temperature of the power FET semiconductor device has risen above the predetermined threshold level.

4. The arrangement according to claim 3 wherein the switching means comprises:

a first bipolar transistor having a base coupled to receive a reference voltage, an emitter coupled to the input of the temperature control circuit and a collector coupled to a first current source; and a first FET transistor having a gate coupled to the collector of the first bipolar transistor, a source coupled to a first power supply and a drain coupled to the first output of the circuit.

5. The arrangement according to claim 4 wherein the circuit means comprises:

a second FET transistor having a gate and a drain coupled to the collector of the first bipolar transistor and a source;

a second bipolar transistor having a collector coupled to the first power supply, an emitter coupled to the source of the second FET transistor and a base coupled to the collector of the first bipolar transistor; and a third FET transistor having a source coupled to the source of the second FET transistor, a drain coupled to the second output of the circuit and a gate coupled to the drain of the second FET transistor, wherein the second and third FET transistors form a current mirror.

* * * * *

UNITED STATES PATENT AND TRADEMARK OFFICE
CERTIFICATE OF CORRECTION

PATENT NO. : 5,389,813
DATED : February 14, 1995
INVENTOR(S) : Walter Schwob

It is certified that error appears in the above-indentified patent and that said Letters Patent is hereby corrected as shown below:

Column 9, claim 2, line 1, delete "diodes" and insert therefore --diode--.

Signed and Sealed this

Ninth Day of January, 1996

Attest:

BRUCE LEHMAN

Attesting Officer

Commissioner of Patents and Trademarks